United States Patent [19]

Sakamoto

[11] Patent Number: 5,398,208
[45] Date of Patent: Mar. 14, 1995

[54] ONE-TIME PROM MICROCOMPUTER

[75] Inventor: Yasuhiko Sakamoto, Kitakatsuragi, Japan

[73] Assignee: Sharp Kabushiki Kaisha, Osaka, Japan

[21] Appl. No.: 246,713

[22] Filed: May 20, 1994

[30] Foreign Application Priority Data

Jul. 28, 1993 [JP] Japan .................. 5-186073

[51] Int. Cl.$^6$ ............................. G11C 13/00
[52] U.S. Cl. ................... 365/226; 365/228
[58] Field of Search ........... 365/226, 227, 228, 189.01, 365/189.05, 230.01

[56] References Cited

U.S. PATENT DOCUMENTS 5,309,399  5/1994  Murotani .............. 365/226

FOREIGN PATENT DOCUMENTS 239722  2/1990  Japan .
256182  11/1991  Japan .

*Primary Examiner*—Terrell W. Fears

[57] ABSTRACT

An OTP microcomputer of the present invention includes: a PROM 14 having a terminal for receiving signals from a voltage supply Vpp that allows a program to be written therein; a MOS transistor to be used as a resistance or a resistance cable containing a pull-up resistance R4, and an input terminal 11 connected to both the terminal of the PROM and a logic circuit of the microcomputer and connected with the drain of the MOS transistor or one end of the resistance R4. In this arrangement, when a microcomputer mode in which the OTP microcomputer is operated as a normal microcomputer is selected, a voltage Vcc ($|Vpp| > |Vcc|$) of a device power supply provided inside the circuit of the microcomputer is supplied to the source of the MOS transistor or the other end of the resistance R4. On the other hand, when an OTP mode in which the PROM is written in with a program is selected, the voltage Vpp of the power supply for allowing a program to be written in is supplied to the source of the MOS transistor or the other end of the resistance R4.

2 Claims, 2 Drawing Sheets

LEVEL SHIFT CIRCUIT

LEVEL SHIFT CIRCUIT

ONE-TIME PROM MICROCOMPUTER

BACKGROUND OF THE INVENTION

(1) Field of the Invention

The present invention relates to an OTP microcomputer (One-Time Programmable ROM Microcomputer), namely, one chip microcomputer with a PROM incorporated that allows a program to be written in for once only. The present invention is in particular directed to an OTP microcomputer having a terminal that serves both a power terminal for program writing and an input terminal for another purpose.

(2) Description of the Prior Art

A typical OTP microcomputer is adapted to be able to be set up in either of microcomputer and OTP modes. In the microcomputer mode, the OTP microcomputer performs normal operations as a microcomputer whereas the microcomputer in the OTP mode allows its PROM to be programmed. In order for an OTP microcomputer to allow its PROM to be written in with a program, an input terminal for receiving a voltage for program writing is needed. A voltage of about 12 V or 21 V is usually employed for writing a program. Since, in OTP microcomputers, the writing of a program is effected once only, it is very inefficient and useless to provide a terminal dedicated to the once-only writing of a program. Therefore, a terminal is tried to be used both as the terminal for the writing and as a terminal for the purpose of the normal operations. A problem as follows, however, occurs if a terminal with a pull-up resistance incorporated therein is used as the combined or double-purpose terminal.

FIG. 1 is a circuit diagram in the vicinity of a terminal having a PMOS transistor as an incorporated pull-up resistance. As shown in the figure, the PMOS transistor serving as the pull-up resistance is connected at its source with a voltage Vcc (of normally about 5 V) and grounded at its gate. The drain is connected to an external input terminal A. In this arrangement, if a voltage Vpp (of about 12 V or 21 V, higher than Vcc) is supplied to the external input terminal A for the purpose of writing a program into the PROM, a current tends to flow into Vcc terminal from Vpp terminal by way of the resistance, causing a short-circuit between the two terminals. When the pull-up resistance is composed of a MOS transistor, the current likewise flows into the well in which the MOS transistor is formed, making the two terminals short-circuited. It is apparent that this short-circuit between the two terminals causes the device to be latched up and therefore damages the device.

For these reasons, the power terminal for programming in an OTP microcomputer was adapted be combined with a terminal that does not have a pull-up resistance incorporated therein, such as a terminal for setting up the microcomputer into a test mode (this terminal will hereinafter be referred to as a test terminal). When the OTP microcomputer is operated in the microcomputer mode, the potential of the test terminal is fixed at the power supply voltage or at the ground potential, so that the test terminal need not have a pull-up resistance incorporated therein. Therefore, this terminal could be used also as the power supply terminal for writing a program.

Microcomputers with such a terminal described above in which a pull-up resistance need not be incorporated as the test terminal are free from this kind of problem, but this approach can not be applied to all microcomputers, since a microcomputer having less number of terminals often lacks such a terminal that is suitable for the combination use as described above. As a example of terminals incorporating a pull-up resistance therein, there is a reset terminal which is negatively active. The terminals of this kind are required to make use of a pull-up resistance in order to turn the power on and reset the modes. Therefore, the pull-up resistance is a requisite in such configurations.

To deal with this, a configuration of a reset terminal and the like can be considered in which a terminal with an external pull-up resistance is provided in lieu of the incorporated pull-up resistance; and programming is performed with the pull-up resistance removed while the use in the normal mode is executed with the external pull-up resistance provided.

However, in many practical applications, another one-chip microcomputer with a mask ROM incorporated therein which has the same function with that of the OTP microcomputer including a PROM therein may be provided in the pin-compatible manner with the OTP microcomputer. In such a case, the mask ROM microcomputer must also be provided with another external pull-up resistance. Provision of a terminal having an incorporated pull-up resistance only for the mask ROM might be considered enough, but does not allow the configuration to be pin-compatible, giving rise to a problem that functions and electric characteristics differ between the OTP and mask ROM microcomputers.

A disclosure in Japanese Patent Application Laid-Open Hei 3 No.256182 shows a method of disconnecting a pull-up resistance when a potential in excess of Vcc is supplied to a terminal having the pull-up resistance incorporated therein. In this method, at both times the pull-up resistance is connected and disconnected, a reset signal must be processed or manipulated after the power is turned on. Therefore, this configuration is unsuitable for OTP microcomputers in which the state of the power supply must be determined at and from the onset of the activation of the power supply.

Anther disclosure in Japanese Patent Application Laid-Open Hei 2 No.39722 shows a method of switching voltages of a power supply. The circuit in this method is operated by supplying input of constant voltages to terminals thereof from the outside. Therefore, this is not suitable for a configuration including a terminal incorporating a pull-up resistance which is operated by supplying a voltage to a signal line only through the pull-up resistance without inputting any voltage to the terminal from the outside.

SUMMARY OF THE INVENTION

It is therefore an object of the present invention to provide a configuration which allows a Vpp-terminal of the OTP microcomputer to be used as a terminal having a pull-up resistance incorporated therein at the time of the microcomputer mode, without exerting any adverse influence such as latch-up and the like upon the device.

The present invention has been achieved in order to attain the above object, and a first aspect of the present invention resides in that an OTP microcomputer comprises:

- a PROM having a terminal for receiving a voltage from a power supply Vpp that allows a program to be written therein;
- a mode-inputting means for selectively inputting a mode-setting signal which selects and designates one mode from a microcomputer mode in which the OTP microcomputer is operated as a normal microcomputer and an OTP mode in which the PROM is written in with a program, the inputting means comprising:

a MOS transistor to be used as a resistance, and an input terminal connected to both the terminal of the PROM and a logic circuit of the microcomputer and connected with the drain of the MOS transistor; and a voltage supplying means supplying voltages in accordance with the input mode-setting signal of the mode-inputting means, wherein, at the time of the OTP mode, the voltage from the power supply Vpp for allowing a program to be written in is supplied to the well and source of the MOS transistor while, at the time of the microcomputer mode, a voltage from a device voltage supply Vcc ($|Vpp| > |Vcc|$) provided inside circuits of the microcomputer is supplied to the well and source of the MOS transistor.

A second aspect of the present invention lies in that an OTP microcomputer comprises:

a PROM having a terminal for receiving a voltage from a power supply Vpp that allows a program to be written therein;

a mode-inputting means for selectively inputting a mode-setting signal which selects and designates one mode from a microcomputer mode in which the OTP microcomputer is operated as a normal microcomputer and an OTP mode in which the PROM is written in with a program, the inputting means comprising:

a resistance cable, and an input terminal connected to both the terminal of the PROM and a logic circuit of the microcomputer and connected with one end of the resistance cable; and a voltage supplying means supplying voltages in accordance with the input mode-setting signal of the mode-inputting means, wherein, at the time of the OTP mode, the voltage from the power supply Vpp for allowing a program to be written in is supplied to the other end of the resistance cable while, at the time of the microcomputer mode, a voltage from a device voltage supply Vcc ($|Vpp| > |Vcc|$) provided inside circuits of the microcomputer is supplied to the other end of the resistance cable.

In the configuration in accordance with the first aspect of the invention, by changing the applied voltage to the well and source of the MOS transistor between Vcc (at the time of the microcomputer mode) and Vpp (at the time of the OTP mode), it is possible to provide such a terminal that, at the time of OTP mode, the terminal works as if it had no pull-up resistance while, at the time of the microcomputer mode, it works as a terminal with a pull-up resistance built therein.

Accordingly, even if a microcomputer has any appropriate input terminal (not pulled up) such as a test terminal that is suitable to use as a Vpp terminal, it is possible, by providing the MOS transistor, to enable a terminal such as a reset terminal which is negatively active, to serve as a Vpp terminal having a pull-up resistance incorporated therein. Thus formed terminal provides the OTP microcomputer having substantially equivalent functions and electric characteristics to those of the microcomputers formed in mask ROM version.

In the invention shown in the second aspect, the same functions described above can be realized likewise by changing the potential of the power supply signal line to which the resistance cable is connected.

DESCRIPTION OF THE PREFERRED EMBODIMENTS

Figure 1:
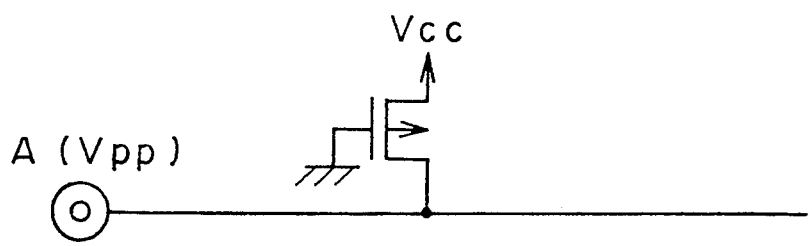
FIG. 1 is a diagram showing an example of a circuit configuration in the vicinity of an input terminal portion for a prior art OTP microcomputer.
Figure 2:
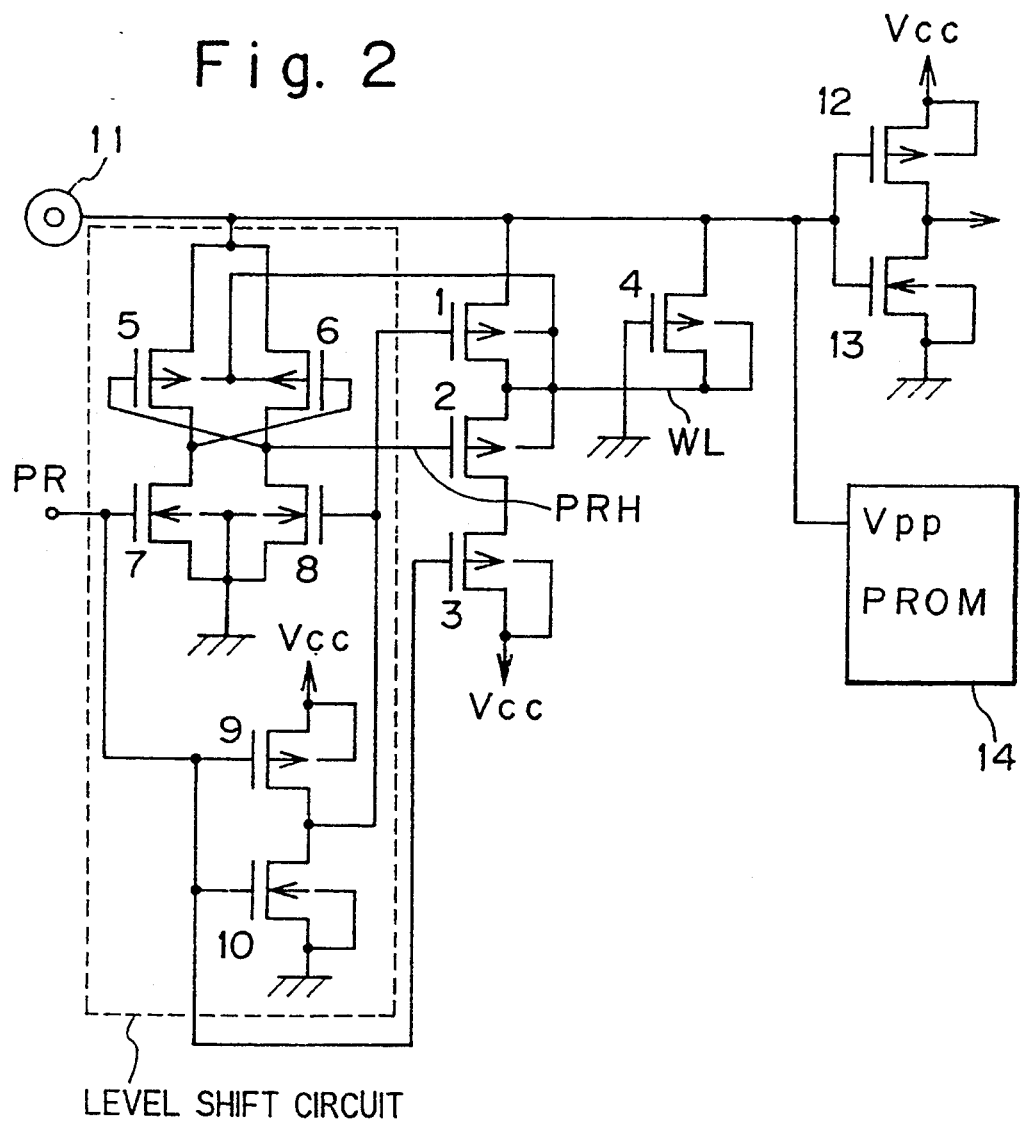
FIG. 2 is a circuit diagram showing an embodiment of an input terminal portion for an OTP microcomputer in accordance with the present invention.

FIG. 2 shows a circuit diagram of an input terminal portion which also serves as a program-writing input for an OTP microcomputer in accordance with an embodiment of the present invention.

In the embodiment, an n-type well is formed on a p-type substrate to form a PMOS transistor which is used as a pull-up resistance. In this figure, a transistor 4 is of a p-channel transistor which serves as the pull-up resistance. Transistors 1 to 3 are provided to supply voltages to the source of transistor 4 and the wells where transistors 1, 2, 4, 5 and 6 are formed. Here, a signal shared by the drains of transistors 1 and 2 is called WL.

An input terminal 11 is supplied by a power source for programming (programming power supply) at the time of OTP mode. The input terminal 11 receives a signal assigned thereto when the microcomputer is in operation (or at the microcomputer mode). Accordingly, the circuit must be constructed such that input terminal 11 is not pulled up at OTP mode while being pulled up at the microcomputer mode.

Transistors 12 and 13 form an inverter which, at the time of the microcomputer mode, receives a signal having a certain logic level from input terminal 11 and transfers the signal to a logic circuit inside the microcomputer. A PROM 14 is provided inside the OTP microcomputer, in which a program is written at the time of OTP mode by supplying a programming power voltage (Vpp) from input terminal 11. At the time of the microcomputer mode, an input level from input terminal 11 is supplied to PROM 14. On the other hand at the time of OTP mode the programming power supply voltage (Vpp) from input terminal 11 is provided to the logic circuit by way of the inverter (of transistors 12 and 13). In either of the cases, an appropriate protective measure is taken to prevent the PROM in the former case or the microcomputer in the latter case from malfunctioning. This has been taken similarly in the prior art configurations where a test terminal is used as an input terminal for program-writing. In other words, this feature does not depend on the type of the terminal.

A circuit comprising transistors 5 to 10 is a level shift circuit. This circuit serves to shift the level of a "H" level output voltage of a signal PR to the potential level of input terminal 11. The well voltages of p-channel transistors 1, 2, 4, 5 and 6 are supplied at the level of signal WL while the well voltages of transistors 3 and 9 are supplied from a device power supply Vcc. The substrate of n-channel transistors 7, 8 and 10 is grounded as to be the substrate potential. A signal PR serves to determine the operation mode of the OTP microcomputer (OTP mode or microcomputer mode) and is supplied through an unillustrated input terminal for detecting the operation mode of the OTP microcomputer. When, with an operation mode having previously been set up through the input terminal, the microcomputer is actuated or the power therefor is turned on, the setup is executed immediately after the power actuation based on the state of the input terminal. In this specific embodiment, signal PR will take "H" level for OTP mode and "L" level for the microcomputer mode.

The operation of the circuit will now be described.

At the time of the microcomputer mode, PR signal is held at "L" level so that transistors 2 and 3 are turned ON while transistor 1 is turned OFF. Therefore, the source and well (WL) of transistor 4 is applied with the voltage Vcc from the device power supply. That is, the signal line from input terminal 11 is pulled up by means of transistor 4 during the microcomputer mode and therefore can be used as an input terminal having a pull-up resistance incorporated therein. Upon practical use, in order to prevent the electric characteristics of transistor 4 from being affected, transistors 2, 3 and 4 are set up such that the following relation holds:

$$R2 + R3 \leq R4$$

where R2, R3 and R4 are resistances of transistors 2, 3 and 4 at their ON-state, respectively.

In OTP mode, transistors 2 and 3 are turned OFF while transistor 1 is turned ON. Therefore, the source and the signal WL of transistor 4 are equally supplied with the voltage of the input level (Vpp) of input terminal 11. Since transistors 2 and 3 are OFF, the signal line from input terminal 11 is disconnected from the device power supply Vcc. When the potential of the input terminal 11 becomes higher than the voltage Vcc of the device power supply, the aforementioned level-shift circuit raises a gate signal PRH to the gate of transistor 2 to the voltage Vpp to maintain transistor 2 to be OFF. In addition, at the time of OTP mode, since the signal WL to be the source voltage of transistor 4 equals in potential with the input terminal 11 to be the drain voltage of the same transistor, transistor 4 can be treated as if it were OFF, even though the transistor 4 is in ON-state because of the gate being grounded. As a result, input terminal 11 at the time of OTP mode can be assumed as a terminal including no pull-up resistance. Accordingly, supplying an input voltage higher than the device power supply voltage Vcc will not exert any adverse influence upon the device.

As has been described, during OTP mode, input terminal 11 can be used as a terminal through which the voltage Vpp for program-writing is supplied whereas the same input terminal can be used as an input terminal having a pull-up resistance incorporated therein at the stage of microcomputer mode. Still more, the setting of the state can be determined immediately after the power supply is turned on.

Figure 3:
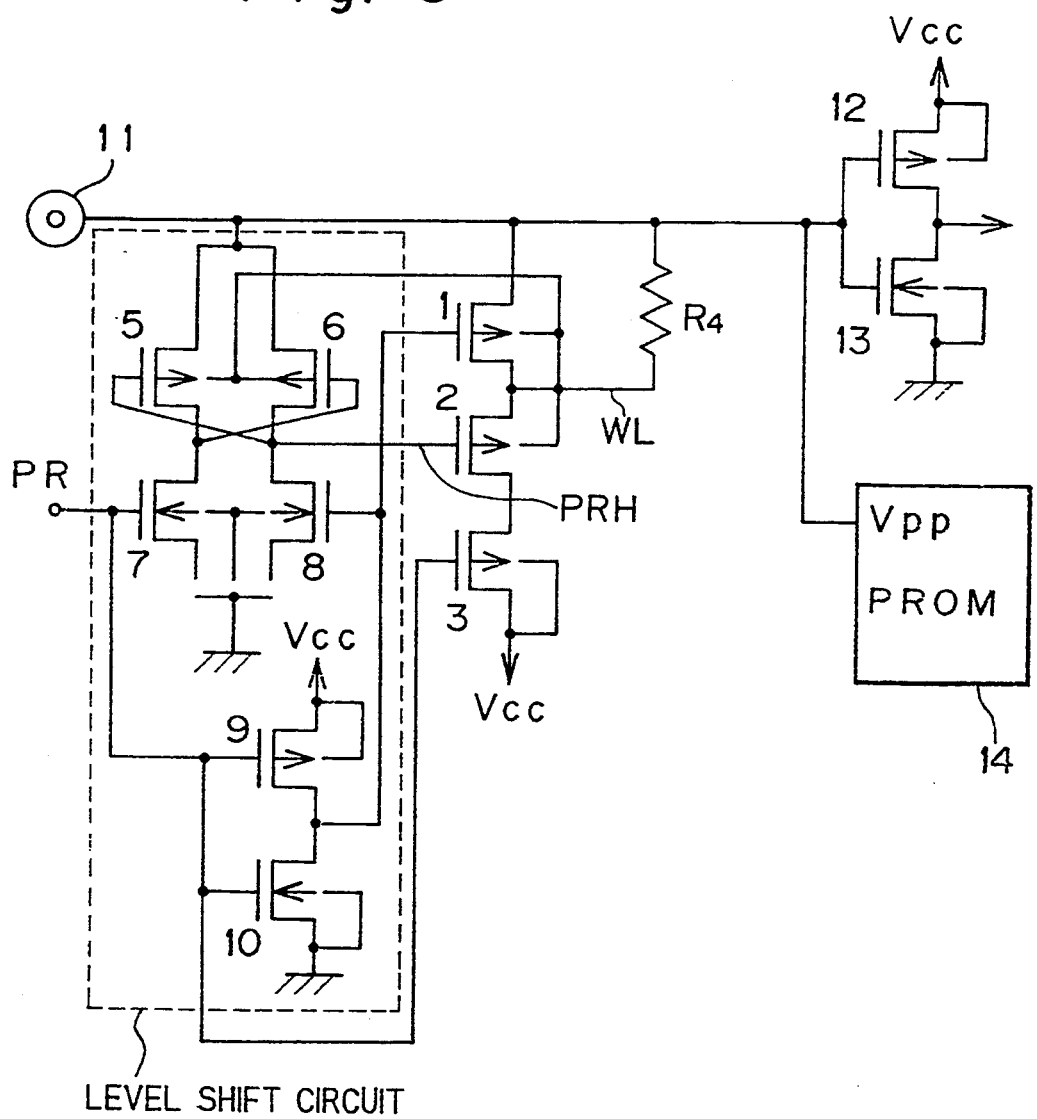
FIG. 3 is a circuit diagram showing another embodiment of an input terminal portion for an OTP microcomputer in accordance with the present invention.

Referring next to FIG. 3, another embodiment of the present invention will be described. A difference of this embodiment from that shown in FIG. 2 is that a high-resistance cable is used for the pull-up resistance in place of a transistor. It will be readily understood that the same function as in FIG. 2 can be realized.

Here, FIG. 3 is a diagram showing a circuit configuration of an input terminal portion that also serves as a terminal for program-writing for an OTP microcomputer in accordance with another embodiment of the present invention.

In this embodiment, a resistance R4 of a high-resistance cable is to work as the pull-up resistance. Transistors 1 to 3 are provided to supply voltages to pull-up resistance R4 and the wells where transistors 1, 2, 5 and 6 are formed. Here, a signal shared by the drains of transistors 1 and 2 is called WL. One end of pull-up resistance R4 is connected to an input terminal 11. This input terminal 11 is supplied by a power source for programming (programming power supply) at the time of OTP mode. The input terminal 11 receives a signal assigned thereto when the microcomputer is in operation (at the microcomputer mode). Accordingly, the circuit must be constructed such that input terminal 11 is not pulled up at OTP mode while being pulled up at the microcomputer mode.

Transistors 12 and 13 form an inverter which, at the time of the microcomputer mode, receives a signal having a certain logic level from input terminal 11 and transfers the signal to a logic circuit inside the microcomputer. A PROM 14 is provided inside the OTP microcomputer, in which a program is written at the time of OTP mode by supplying a programming power supply voltage (Vpp) from input terminal. At the time of the microcomputer mode, an input level from input terminal 11 is supplied to PROM 14. On the other hand at the time of OTP mode the programming power supply voltage (Vpp) from input terminal 11 is provided to the logic circuit by way of the inverter (of transistors 12 and 13). In either of the cases, an appropriate protective measure is taken to prevent the PROM in the former case or the microcomputer in the latter case from malfunctioning. This has been taken similarly in the prior art configurations where a test terminal is used as an input terminal for program-writing. In other words, this feature does not depend on the type of the terminal.

A circuit comprising transistors 5 to 10 is a level shift circuit. This circuit serves to shift the level of a "H" level output voltage of a signal PR to the potential of input terminal 11. The well voltages of p-channel transistors 1, 2, 5 and 6 are applied at the level of signal WL while a device voltage of R4 and the well voltages of transistors 3 and 9 are supplied from a device power supply Vcc. The substrate of n-channel transistors 7, 8 and 10 is grounded as to be the substrate potential. A signal PR serves to determine the operation mode of the OTP microcomputer (OTP mode or microcomputer mode) and is supplied through an unillustrated input terminal for detecting the operation mode of the OTP microcomputer. When, with an operation mode having previously been set up through the input terminal, the microcomputer is actuated or the power therefor is turned on, the setting is executed immediately after the power actuation based on the state of the input terminal. In this specific embodiment, signal PR will take "H" level for OTP mode and "L" level for the microcomputer mode.

The operation of the circuit will now be described.

At the time of the microcomputer mode, PR signal is held at "L" level so that transistors 2 and 3 are turned ON while transistor 1 is turned OFF. Therefore, the other end of pull-up resistance R4 is applied with the voltage Vcc from the device power supply. That is, the signal line from input terminal 11 is pulled up by means of pull-up resistance R4 during the microcomputer mode and therefore can be used as an input terminal having a pull-up resistance incorporated therein. Upon practical use, transistors 2 and 3 are set up such that the following relation holds:

$$R2+R3 \leq R4$$

where R2 and R3 are resistances of transistors 2 and 3 at their ON-state, respectively.

At the time of OTP mode, transistors 2 and 3 are turned OFF while transistor 1 is turned ON. Therefore, both ends of pull-up resistance 4 are equally applied with the voltage of the input level (Vpp) of input terminal 11. Since transistors 2 and 3 are OFF, the signal line from input terminal 11 is disconnected from the device power supply Vcc. When the potential of the input terminal 11 becomes higher than the voltage Vcc of the device power supply, the aforementioned level-shift circuit raises a gate signal PRH to the gate of transistor 2 to the voltage Vpp to maintain transistor 2 to be OFF. In addition, at the time of OTP mode, since the potentials at both ends of pull-up resistance R4 equal each other, pull-up resistance R4 can be considered as if the pull-up resistance R4 were OFF or there were no resistance. As a result, input terminal 11 in OTP mode can be assumed that pull-up resistance R4 is eliminated. Accordingly, supplying an input voltage higher than the device power supply voltage Vcc will not exert an adverse influence upon the device.

As has been described heretofore, according to the present invention, at the development of OTP microcomputers it is possible to use a terminal having a pull-up resistance incorporated therein as a terminal for Vpp. That is, even if a microcomputer having a less number of terminals does not have any terminal such as a test terminal that is suitable for the use as a Vpp terminal, it is possible to use a terminal such as a reset terminal or the like as the Vpp terminal. In such a combined terminal, there is no need to modify the functions and characteristics of unselected part of the combined terminal.

Incidentally, in the case of an operation of the microcomputer of the present invention in a reversed polarity from the polarity of the aforementioned embodiments, it is equally operable by selecting a transistor with a proper conduction type.

What is claimed is:

1. An OTP microcomputer comprising:
   a PROM having a terminal for receiving a voltage from a power supply Vpp that allows a program to be written therein;
   a mode-inputting means for selectively inputting a mode-setting signal which selects and designates one mode from a microcomputer mode in which the OTP microcomputer is operated as a normal microcomputer and an OTP mode in which said PROM is written in with a program, said inputting means comprising:
   a MOS transistor to be used as a resistance, and
   an input terminal connected to both said terminal of said PROM and a logic circuit of the microcomputer and connected with the drain of said MOS transistor; and
   a voltage supplying means supplying voltages in accordance with said input mode-setting signal of said mode-inputting means, wherein, at the time of the OTP mode, the voltage from said power supply Vpp for allowing a program to be written in is supplied to the well and source of said MOS transistor while, at the time of the microcomputer mode, a voltage from a device power supply Vcc ($|Vpp| > |Vcc|$) provided inside circuits of the microcomputer is supplied to the well and source of said MOS transistor.

2. An OTP microcomputer comprising:
   a PROM having a terminal for receiving a voltage from a power supply Vpp that allows a program to be written therein;
   a mode-inputting means for selectively inputting a mode-setting signal which selects and designates one mode from a microcomputer mode in which the OTP microcomputer is operated as a normal microcomputer and an OTP mode in which said PROM is written in with a program, said inputting means comprising:
   a resistance cable, and
   an input terminal connected to both said terminal of said PROM and a logic circuit of the microcomputer and connected with one end of said resistance cable; and
   a voltage supplying means supplying voltages in accordance with said input mode-setting signal of said mode-inputting means, wherein, at the time of the OTP mode, the voltage from said power supply Vpp for allowing a program to be written in is supplied to the other end of said resistance cable while, at the time of the microcomputer mode, a voltage from a device voltage supply Vcc ($|Vpp| > |VCC|$) provided inside circuits of the microcomputer is supplied to the other end of said resistance cable.

* * * * *